(12) United States Patent
Tawara et al.

(10) Patent No.: US 11,183,590 B2
(45) Date of Patent: Nov. 23, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Tae Tawara, Tsukuba (JP); Shinji Fujikake, Omuta (JP); Aki Takigawa, Hachioji (JP); Hidekazu Tsuchida, Yokosuka (JP); Koichi Murata, Yokosuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/984,092

(22) Filed: Aug. 3, 2020

(65) Prior Publication Data
US 2021/0074850 A1 Mar. 11, 2021

(30) Foreign Application Priority Data
Sep. 10, 2019 (JP) .............................. JP2019-164815

(51) Int. Cl.
*H01L 29/78* (2006.01)
*H01L 29/66* (2006.01)
(Continued)

(52) U.S. Cl.
CPC ........ *H01L 29/7813* (2013.01); *H01L 29/401* (2013.01); *H01L 29/4236* (2013.01); *H01L 29/66734* (2013.01)

(58) Field of Classification Search
CPC ............... H01L 21/0475; H01L 21/049; H01L 29/7813; H01L 29/08; H01L 29/16;
(Continued)

(56) References Cited

U.S. PATENT DOCUMENTS

2005/0106847 A1 * 5/2005 Hiruta ................... H01L 21/324
438/585
2013/0330896 A1 12/2013 Miyahara et al.
(Continued)

FOREIGN PATENT DOCUMENTS

JP 2005150398 A 6/2005
JP 2013069854 A 4/2013

OTHER PUBLICATIONS

Ishihara Takamitsu et al., "Construction of Accurate Mobility Model for MOSFETs", Toshiba Review, vol. 58, No. 5 (2003).

*Primary Examiner* — Fazli Erdem
(74) *Attorney, Agent, or Firm* — Rabin & Berdo, P.C.

(57) ABSTRACT

A semiconductor device including a semiconductor substrate of a first conductivity type, a first semiconductor layer of the first conductivity type, provided at a front surface of the semiconductor substrate and having an impurity concentration lower than that of the semiconductor substrate, a second semiconductor layer of a second conductivity type, selectively provided on the first semiconductor layer, a first semiconductor region of the first conductivity type, selectively provided in the second semiconductor layer and having an impurity concentration higher than that of the semiconductor substrate, a trench penetrating the first semiconductor region and the second semiconductor layer, to reach the first semiconductor layer, and a gate electrode provided in the trench, via a gate insulating film. The trench has a sidewall that includes a terrace portion, surface roughness of the terrace portion being at most 0.1 nm.

5 Claims, 7 Drawing Sheets

(51) Int. Cl.
*H01L 29/40* (2006.01)
*H01L 29/423* (2006.01)

(58) Field of Classification Search
CPC ......... H01L 29/40; H01L 29/42; H01L 29/66;
H01L 29/78; H01L 29/1095; H01L
29/0878; H01L 29/1608; H01L 29/401;
H01L 29/66734; H01L 29/0623; H01L
29/4236; H01L 29/66068
USPC ........................................................ 257/330
See application file for complete search history.

(56) References Cited

U.S. PATENT DOCUMENTS

2019/0172912 A1\* 6/2019 Hirose ................ H01L 29/7813
2021/0183644 A1\* 6/2021 Hsieh ................. H01L 21/0337

\* cited by examiner

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2019-164815, filed on Sep. 10, 2019, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to reduce the ON resistance of an element in a power semiconductor device, a vertical metal oxide semiconductor field effect transistor (MOSFET) having a trench structure is fabricated (manufactured). In the vertical MOSFET, the trench structure in which a channel is formed orthogonal to a substrate surface enables the cell density per unit area to be increased more easily as compared to a planar structure in which the channel is formed parallel to the substrate surface. Therefore, with the trench structure, the current density per unit area may be increased more than with a planar structure and in terms of cost, this is advantageous.

A trench gate structure is a 3-dimensional structure in which an insulated gate (MOS gate) that includes a metal, an oxide film, and a semiconductor is embedded in a trench formed in a semiconductor base (hereinafter, silicon carbide base) that contains silicon carbide; the 3-dimensional structure uses a portion along a trench sidewall as a channel (inversion layer). Thus, when elements having the same ON resistance (Ron) are compared, the trench gate structure may have a significantly smaller element area (chip area) than that of a planar gate structure in which the MOS gate is provided in flat shape on a silicon carbide base and the trench gate structure may be considered to be a promising device structure.

Here, electrical characteristics of a semiconductor device are determined by carrier mobility. Mobility of a MOSFET is determined by a combination of phonon scattering, Coulomb scattering, interface roughness scattering (for example, refer to ISHIHARA Takamitsu, MATSUZAWA Kazuya, "Construction of Accurate Mobility Model for MOSFETs", Toshiba Review, Vol. 58, No. 5 (2003)). Here, phonon scattering is scattering due to lattice vibration in silicon crystals. Coulomb scattering is scattering due to a Coulomb scattering source such as ionized impurities in a substrate or fixed charges in a gate insulating film. Interface roughness scattering is scattering due to unevenness between the gate insulating film and the substrate. Phonon scattering is the predominant type of scattering at high temperatures while Coulomb scattering is predominant with low electric fields and interface roughness scattering is predominate with high electric fields.

Further, to enhance channel mobility and gate oxide film reliability, a technique of planarizing the surface of a substrate to have a surface roughness Ra of at most 0.3 nm is commonly known (for example, refer to Japanese Laid-Open Patent Publication No. 2013-069854). Further, to planarize a semiconductor surface of an insulating film formation region to have a surface roughness (standard deviation of roughness) Rms of at most 0.5 nm, a technique of performing an annealing treatment of the semiconductor substrate in a hydrogen atmosphere or performing an annealing treatment of the semiconductor substrate in a mixed gas atmosphere containing a mixture of an inert gas and hydrogen is commonly known (for example, refer to Japanese Laid-Open Patent Publication No. 2005-150398).

SUMMARY OF THE INVENTION

According to an embodiment of the invention, a semiconductor device includes a semiconductor substrate of a first conductivity type, the semiconductor substrate having a front surface and a back surface; a first semiconductor layer of the first conductivity type, provided at the front surface of the semiconductor substrate and having an impurity concentration lower than that of the semiconductor substrate, the first semiconductor layer having a first side and a second side opposite to each other, the first side facing the semiconductor substrate; a second semiconductor layer of a second conductivity type, selectively provided at the second side of the first semiconductor layer; a first semiconductor region of the first conductivity type, selectively provided in the second semiconductor layer and having an impurity concentration higher than that of the semiconductor substrate; a trench penetrating the first semiconductor region and the second semiconductor layer, to reach the first semiconductor layer; and a gate electrode provided in the trench, via a gate insulating film. The trench has a sidewall that includes a terrace portion, surface roughness of the terrace portion being at most 0.1 nm.

According to another embodiment of the inventions, a method of manufacturing a semiconductor device includes preparing a semiconductor substrate of a first conductivity type, the semiconductor substrate having a front surface and a back surface; forming a first semiconductor layer of the first conductivity type, at the front surface of the semiconductor substrate, the first semiconductor layer having an impurity concentration lower than that of the semiconductor substrate, the first semiconductor layer having a first side and a second side opposite to each other, the first side facing the semiconductor substrate; forming a second semiconductor layer of a second conductivity type, at the second side of the first semiconductor layer; selectively forming a first semiconductor region of the first conductivity type in the second semiconductor layer, the first semiconductor region having an impurity concentration higher than that of the semiconductor substrate; forming a trench penetrating the first semiconductor region and the second semiconductor layer, to reach the first semiconductor layer; performing a first annealing treatment to the trench in a hydrogen atmosphere, and, after the first annealing treatment, performing a second annealing treatment to the trench in a mixed gas atmosphere containing hydrogen and nitrogen; and forming a gate electrode in the trench, via a gate insulating film.

In the embodiment, for the mixed gas atmosphere, a gas flow ratio of a nitrogen gas to a hydrogen gas is in a range from 1% to 80%.

In the embodiment, for the mixed gas atmosphere, a gas flow ratio of a nitrogen gas to a hydrogen gas is in a range from 4% to 50%.

In the embodiment, for the mixed gas atmosphere, a gas flow ratio of a nitrogen gas to a hydrogen gas is in a range from 5% to 50%.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
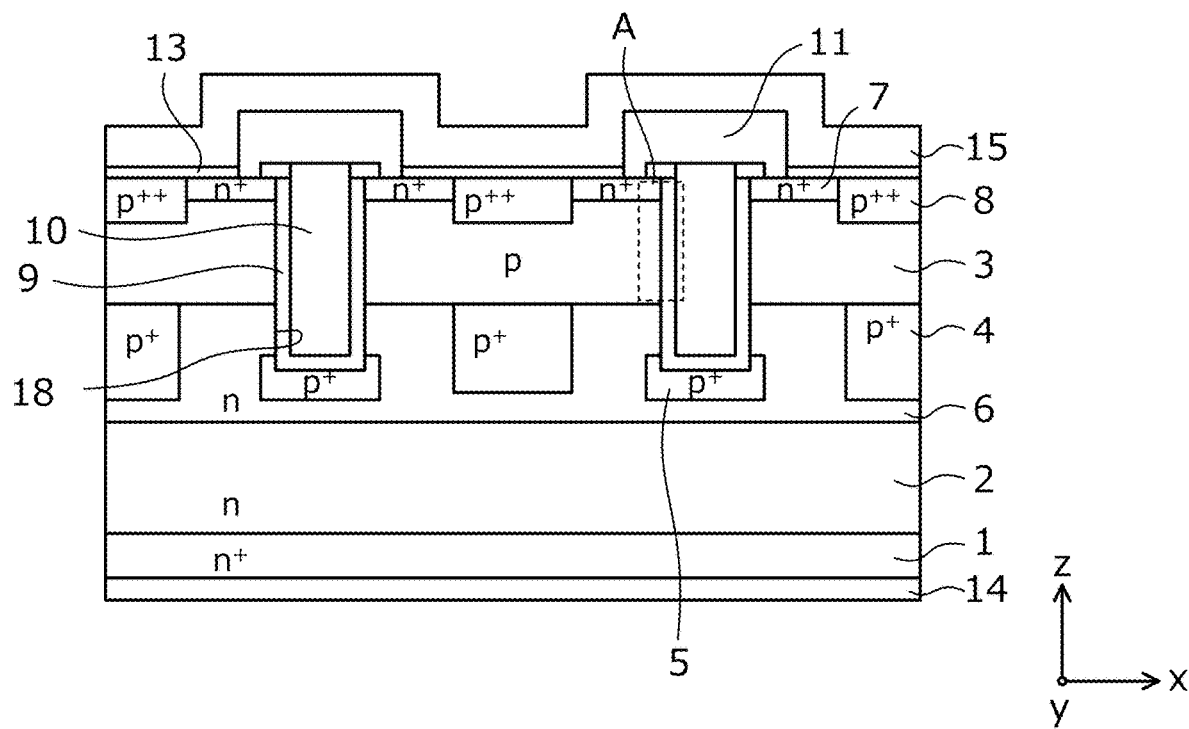
FIG. 1 is a cross-sectional view of a structure of a silicon carbide semiconductor device according to an embodiment.

First, problems associated with the conventional techniques will be discussed. By improving gate processes, Coulomb scattering is reduced, enabling mobility to be enhanced. Further, by reducing the unevenness between the gate insulating film and the substrate, interface roughness scattering is suppressed, enabling mobility to be enhanced.

Further, in current trench-type MOSFETs, the surface roughness Ra of the trench sidewall is at least 0.1 nm before the process of forming the gate insulating film and this surface roughness Ra affects interface roughness scattering, thereby hindering the enhancement of mobility. Herein, the surface roughness Ra is arithmetical mean roughness (Ra) of a surface.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

A semiconductor device according to the present invention is configured using a wide bandgap semiconductor. In an embodiment, a silicon carbide semiconductor device fabricated using, for example, silicon carbide (SiC) as the wide bandgap semiconductor is described taking a MOSFET as an example. FIG. 1 is a cross-sectional view of a structure of the silicon carbide semiconductor device according to the embodiment.

As depicted in FIG. 1, in the silicon carbide semiconductor device according to the embodiment, an n-type silicon carbide epitaxial layer (first semiconductor layer of the first conductivity type) 2 is deposited on a first main surface (front surface), e.g., a (0001) plane (Si-face), of an n$^+$-type silicon carbide substrate (semiconductor substrate of a first conductivity type) 1.

The n$^+$-type silicon carbide substrate 1 is a silicon carbide single crystal substrate doped with, for example, nitrogen (N). The n-type silicon carbide epitaxial layer 2 is a low-concentration n-type drift layer doped with, for example, nitrogen and having an impurity concentration lower than that of the n$^+$-type silicon carbide substrate 1. At a surface of a first side of the n-type silicon carbide epitaxial layer 2, opposite a second side thereof facing the n$^+$-type silicon carbide substrate 1, an n-type high-concentration region 6 is formed. The n-type high-concentration region 6 is a high-concentration n-type drift layer doped with, for example, nitrogen and having an impurity concentration lower than that of the n$^+$-type silicon carbide substrate 1 and higher than that of the n-type silicon carbide epitaxial layer 2. Hereinafter, the n$^+$-type silicon carbide substrate 1, the n-type silicon carbide epitaxial layer 2, and a p-type silicon carbide epitaxial layer (second semiconductor layer of a second conductivity type) 3 described hereinafter combined are assumed as a silicon carbide semiconductor base.

As depicted in FIG. 1, at a second main surface (back surface, i.e., back surface of the silicon carbide semiconductor base) of the n$^+$-type silicon carbide substrate 1, a back electrode 14 is provided. The back electrode 14 configures a drain electrode. At a surface of the back electrode 14, a drain electrode pad (not depicted) is provided.

At a first side (side having the p-type silicon carbide epitaxial layer 3) of the silicon carbide semiconductor base, a trench structure is formed. In particular, trenches 18 penetrate through the p-type silicon carbide epitaxial layer 3 from a surface of a first side (the first side of the silicon carbide semiconductor base) of the p-type silicon carbide epitaxial layer 3, opposite a second side thereof facing the $n^+$-type silicon carbide substrate 1, and reach the n-type silicon carbide epitaxial layer 2. Along inner walls of the trenches 18, a gate insulating film 9 is formed at bottoms and sidewalls of the trenches 18; gate electrodes 10 are formed on the gate insulating film 9 in the trenches 18, respectively. The gate electrodes 10 are insulated from the n-type silicon carbide epitaxial layer 2 and the p-type silicon carbide epitaxial layer 3 by the gate insulating film 9. A portion of each of the gate electrodes 10 may protrude from a top (side facing a source electrode pad 15) of the trench 18, toward the source electrode pad 15.

In a surface layer of the first side (the first side of the silicon carbide semiconductor base) of the n-type silicon carbide epitaxial layer 2, opposite the second side thereof facing the $n^+$-type silicon carbide substrate 1, first $p^+$-type base regions 4 and second $p^+$-type base regions 5 are selectively provided. The second $p^+$-type base regions 5 are formed beneath the trenches 18, respectively and a width of each of the second $p^+$-type base regions 5 is wider than a width of each of the trenches 18. The first $p^+$-type base regions 4 and the second $p^+$-type base regions 5 are doped with, for example, aluminum.

Configuration may be such that a part of each of the first $p^+$-type base regions 4 extends toward the trenches 18 to be connected to the second $p^+$-type base regions 5. In this case, these parts of the first $p^+$-type base regions 4 may have a planar layout in which the parts repeatedly alternate with parts of the n-type high-concentration region 6 in a direction (hereinafter, second direction) y that is orthogonal to a direction (hereinafter, first direction) x along which the first $p^+$-type base regions 4 and the second $p^+$-type base regions 5 are arranged.

At the first side of the n-type silicon carbide epitaxial layer 2, the p-type silicon carbide epitaxial layer 3 is provided. In the p-type silicon carbide epitaxial layer 3, $n^+$-type source regions (first semiconductor regions of the first conductivity type) 7 and $p^{++}$-type contact regions 8 are selectively provided at the first side of the silicon carbide semiconductor base. The $n^+$-type source regions 7 are in contact with the trenches 18. Further, the $n^+$-type source regions 7 and the $p^{++}$-type contact regions 8 are in contact with one another. The n-type high-concentration region 6 is provided in regions between the p-type silicon carbide epitaxial layer 3 and the second $p^+$-type base regions 5, and in regions between the first $p^+$-type base regions 4 and the second $p^+$-type base regions 5 in the surface layer of the first side of the n-type silicon carbide epitaxial layer 2.

In FIG. 1, while only two trench MOS structures are depicted, further MOS gate (insulated gate having a metal, an oxide film, and a semiconductor) structures having a trench structure may be disposed in parallel.

An interlayer insulating film 11 is provided at an entire surface of the first side of the silicon carbide semiconductor base so as to cover the gate electrodes 10 embedded in the trenches 18. A source electrode 13 is in contact with the $n^+$-type source regions 7 and the $p^{++}$-type contact regions 8, via contact holes opened in the interlayer insulating film 11. The source electrode 13 is electrically insulated from the gate electrodes 10 by the interlayer insulating film 11. On the source electrode 13, the source electrode pad 15 is provided. Between the source electrode 13 and the interlayer insulating film 11, for example, a barrier metal (not depicted) that prevents diffusion of metal atoms from the source electrode 13 to the gate electrodes 10 may be provided.

Figure 2:
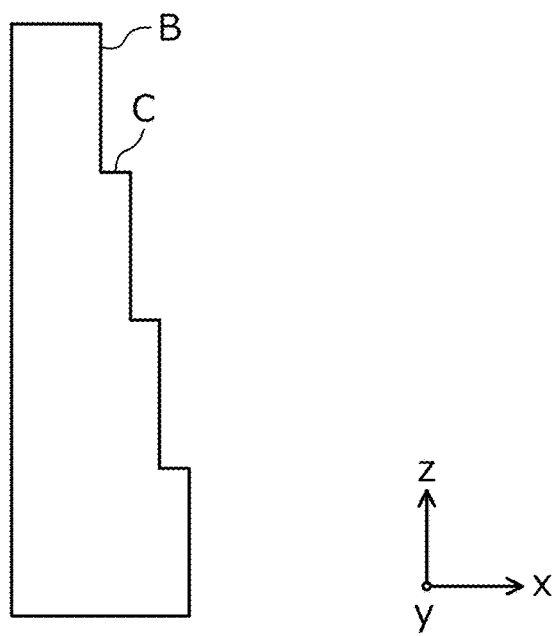
FIG. 2 is an enlarged cross-sectional view of a sidewall portion A of a trench of the silicon carbide semiconductor device according to the embodiment.

FIG. 2 is an enlarged cross-sectional view of a sidewall portion A of a trench of the silicon carbide semiconductor device according to the embodiment. As depicted in FIG. 2, each sidewall of the trenches 18 is configured by a terrace portion B and stepped portion C. Here, the terrace portion B is a sidewall in a direction z and the stepped portion C is a sidewall the direction x.

The surface roughness Ra of the stepped portion C is determined by a lattice constant of silicon carbide crystal, etc. and is dependent on angles between silicon carbide crystals and the trenches 18. On the other hand, the surface roughness Ra of the terrace portion B may be planarized by etching, annealing, etc. Therefore, in the embodiment, as described in detail with a method of manufacturing hereinafter, after hydrogen annealing is performed with respect to the trenches 18, nitrogen-added annealing is performed, making the surface roughness Ra of the terrace portion B at most 0.1 nm. As a result, the surface roughness Ra of the sidewalls of the trenches 18 is reduced, thereby reducing the effects of interface roughness scattering, whereby mobility is maximally enhanced. Further, since interface roughness scattering is predominant with high electric fields, reduction of the effects of interface roughness scattering enables decreases in mobility at higher electric fields to be suppressed.

A method of manufacturing the silicon carbide semiconductor device according to the embodiment will be described. FIGS. 3, 4, 5, 6, 7, 8, and 9 are cross-sectional views schematically depicting states of the silicon carbide semiconductor device according to the embodiment during manufacture.

Figure 3:
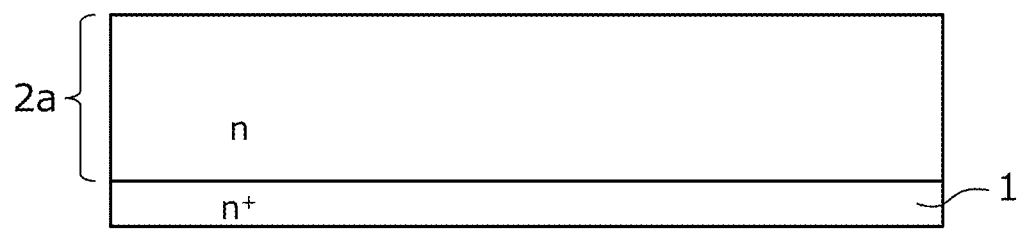
FIG. 3 is a cross-sectional view schematically depicting a state of the silicon carbide semiconductor device according to the embodiment during manufacture.

First, the $n^+$-type silicon carbide substrate 1 containing silicon carbide of an n-type is prepared. Subsequently, on the first main surface of the $n^+$-type silicon carbide substrate 1, a first n-type silicon carbide epitaxial layer 2a containing silicon carbide is formed by epitaxial growth to have a thickness of, for example, about 30 μm while an n-type impurity, for example, nitrogen atoms, is doped. The first n-type silicon carbide epitaxial layer 2a forms the n-type silicon carbide epitaxial layer 2. The state up to here is depicted in FIG. 3.

Figure 4:
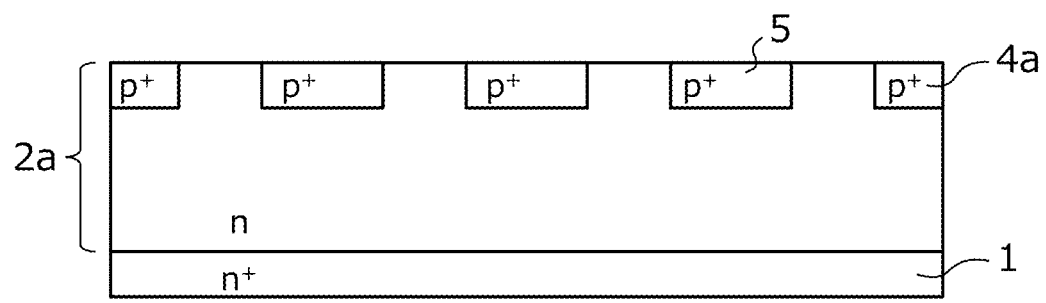
FIG. 4 is a cross-sectional view schematically depicting a state of the silicon carbide semiconductor device according to the embodiment during manufacture.

Next, on a surface of the first n-type silicon carbide epitaxial layer 2a, an ion implantation mask having predetermined openings is formed by a photolithographic technique using, for example, an oxide mask. Subsequently, a p-type impurity such as aluminum is implanted in the openings of the oxide film, thereby forming lower first $p^+$-type base regions 4a to a depth of about 0.5 μm. Concurrently with the lower first $p^+$-type base regions 4a, the second $p^+$-type base regions 5 that form the bottoms of the trenches 18 may be formed. Formation is such that a distance between a lower first $p^+$-type base region 4a and a second $p^+$-type base region 5 adjacent thereto is about 1.5 μm. An impurity concentration of the lower first $p^+$-type base regions 4a and the second $p^+$-type base regions 5 is set to be, for example, about $5 \times 10^{18}/cm^3$. The state up to here is depicted in FIG. 4.

Next, portions of the ion implantation mask are removed, an n-type impurity such as nitrogen is ion implanted in the openings, thereby forming, at surface regions of the first n-type silicon carbide epitaxial layer 2a, a lower n-type high-concentration region 6a to a depth of, for example, about 0.5 μm. An impurity concentration of the lower n-type high-concentration region 6a is set to be, for example, about $1 \times 10^{17}/cm^3$.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer $2b$ is set to be about $3\times10^{15}/cm^3$. Hereinafter, the first n-type silicon carbide epitaxial layer $2a$ and the second n-type silicon carbide epitaxial layer $2b$ combined form the n-type silicon carbide epitaxial layer 2.

Next, on a surface of the second n-type silicon carbide epitaxial layer $2b$, an ion implantation mask having predetermined openings is formed by photolithography using, for example, an oxide mask. Subsequently, a p-type impurity such as aluminum is implanted in the openings of the oxide film, thereby forming upper first $p^+$-type base regions $4b$ to a depth of about 0.5 μm, so as to overlap the lower first $p^+$-type base regions $4a$, respectively. The lower first $p^+$-type base regions $4a$ and the upper first $p^+$-type base regions $4b$ form connected regions and thereby, form the first $p^+$-type base regions 4. An impurity concentration of the upper first $p^+$-type base regions $4b$ is set to be, for example, about $5\times10^{18}/cm^3$.

Figure 5:
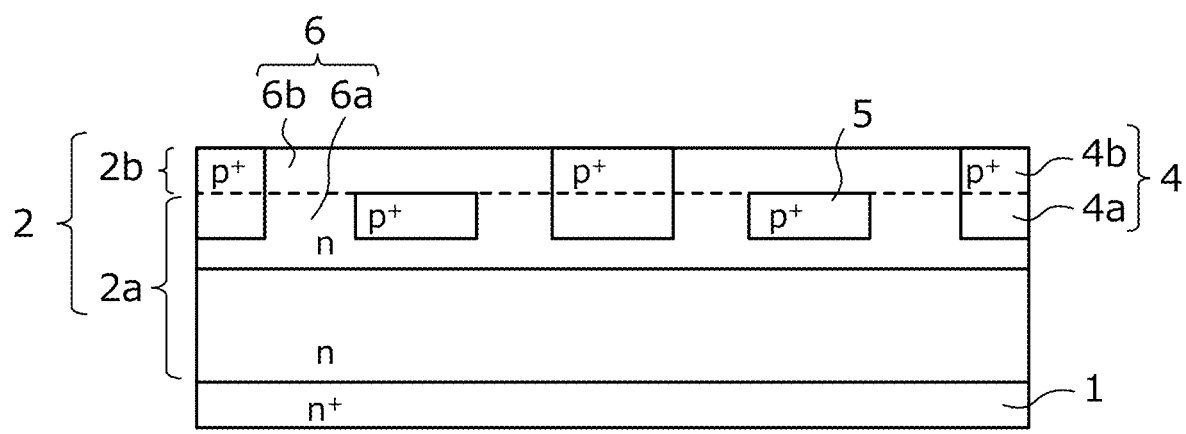
FIG. 5 is a cross-sectional view schematically depicting a state of the silicon carbide semiconductor device according to the embodiment during manufacture.

Next, portions of the ion implantation mask are removed, a n-type impurity such as nitrogen is ion implanted in the openings, thereby forming, at surface regions of the second n-type silicon carbide epitaxial layer $2b$, an upper n-type high-concentration region $6b$ to a depth of, for example, about 0.5 μm. An impurity concentration of the upper n-type high-concentration region $6b$ is set to be, for example, about $1\times10^{17}/cm^3$. The upper n-type high-concentration region $6b$ and the lower n-type high-concentration region $6a$ are formed to be at least partially connected and thereby, form the n-type high-concentration region 6. Nonetheless, the n-type high-concentration region 6 may be formed at an entire substrate surface or may be omitted. The state up to here is depicted in FIG. 5.

Figure 6:
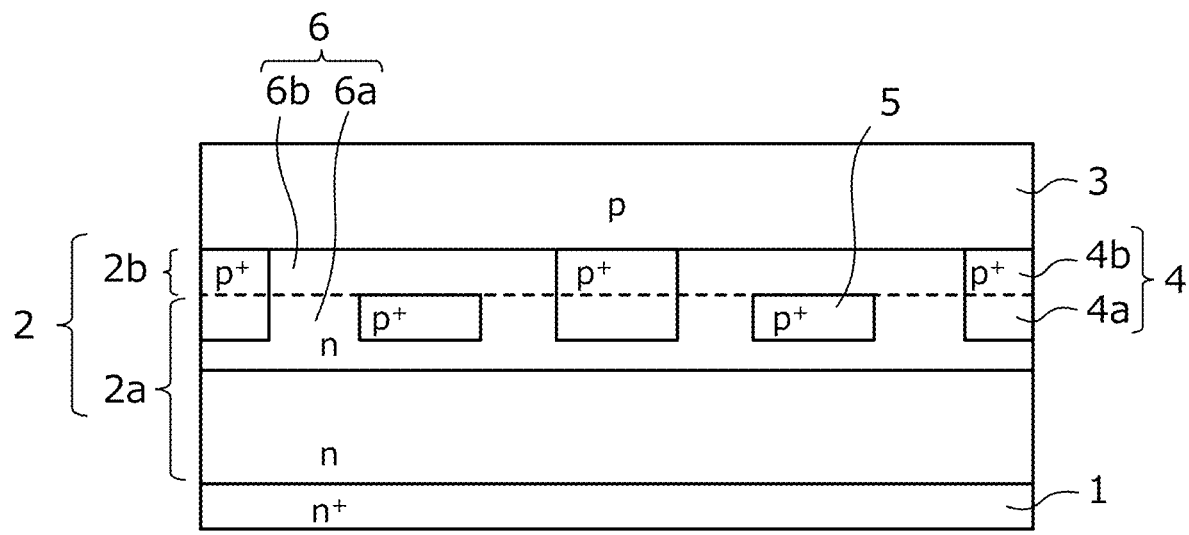
FIG. 6 is a cross-sectional view schematically depicting a state of the silicon carbide semiconductor device according to the embodiment during manufacture.

Next, on the surface of the n-type silicon carbide epitaxial layer 2, the p-type silicon carbide epitaxial layer 3 doped with a p-type impurity such as aluminum is formed to have a thickness of about 1.3 μm. An impurity concentration of the p-type silicon carbide epitaxial layer 3 is set to be about $4\times10^{17}/cm^3$. The state up to here is depicted in FIG. 6.

Figure 7:
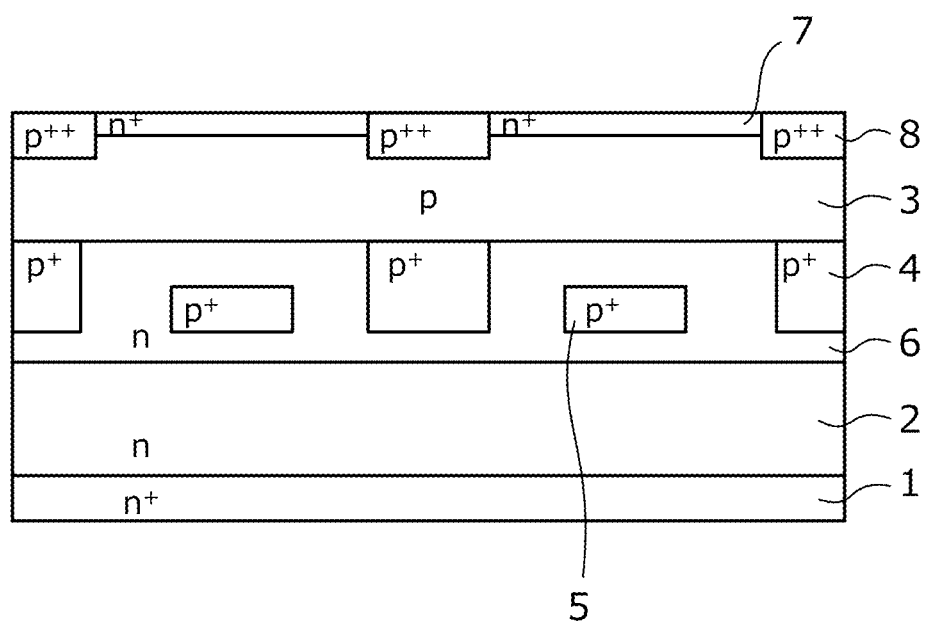
FIG. 7 is a cross-sectional view schematically depicting a state of the silicon carbide semiconductor device according to the embodiment during manufacture.

Next, on surface of the p-type silicon carbide epitaxial layer 3 and the exposed n-type silicon carbide epitaxial layer 2, an ion implantation mask having predetermined openings is formed by photolithography using, for example, an oxide mask. An n-type impurity such as phosphorus (P) is ion implanted in the openings, thereby forming the $n^+$-type source regions 7 at portions of the surface of the p-type silicon carbide epitaxial layer 3. An impurity concentration of the $n^+$-type source regions 7 is set to be higher than the impurity concentration of the p-type silicon carbide epitaxial layer 3. Next, the ion implantation mask used in forming the $n^+$-type source regions 7 is removed and by a similar method, an ion implantation mask having predetermined openings is formed, a p-type impurity such as aluminum is ion implanted at portions of the surface of the p-type silicon carbide epitaxial layer 3, thereby forming the $p^{++}$-type contact regions 8. An impurity concentration of the $p^{++}$-type contact regions 8 is set to be higher than the impurity concentration of the p-type silicon carbide epitaxial layer 3. The state up to here is depicted in FIG. 7.

Next, a heat treatment (annealing) is performed in an inert gas atmosphere of about 1700 degrees C., thereby implementing an activation process for the first $p^+$-type base regions 4, the second $p^+$-type base regions 5, the $n^+$-type source regions 7, and the $p^{++}$-type contact regions 8. As described above, ion implanted regions may be activated by a single heat treatment or may be activated by performing the heat treatment each time ion implantation is performed.

Figure 8:
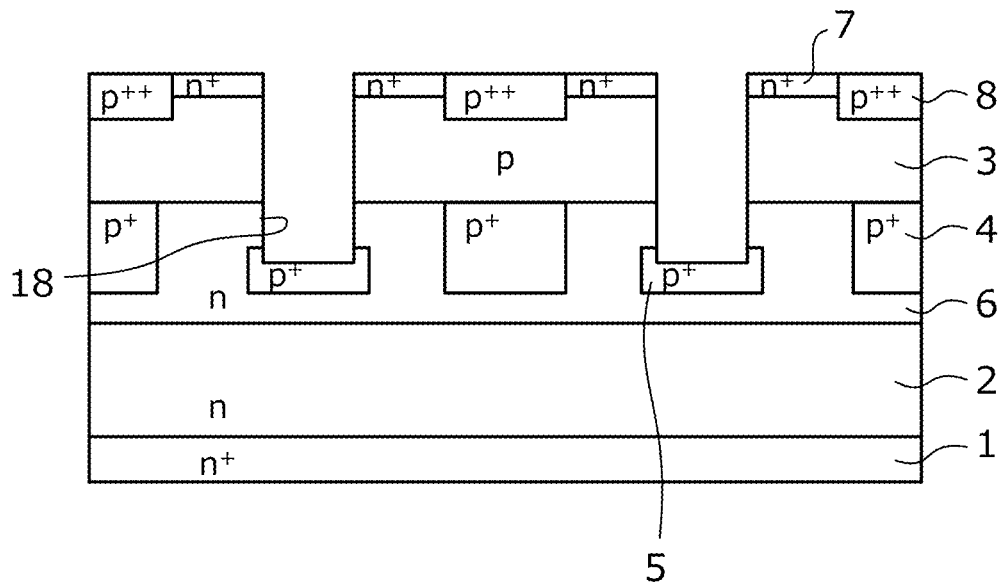
FIG. 8 is a cross-sectional view schematically depicting a state of the silicon carbide semiconductor device according to the embodiment during manufacture.

Next, on the surface of the p-type silicon carbide epitaxial layer 3, a trench formation mask having predetermined openings is formed by photolithography using, for example, an oxide film. Next, the trenches 18 that penetrate through the p-type silicon carbide epitaxial layer 3 and reach the n-type silicon carbide epitaxial layer 2 are formed by dry etching. The bottoms of the trenches 18 may, respectively, reach the second $p^+$-type base regions 5 formed in the n-type silicon carbide epitaxial layer 2. Next, the trench formation mask is removed. The state up to here is depicted in FIG. 8.

Next, annealing for rounding the bottoms of the trenches 18 and openings of the trenches 18 is performed. Before the annealing is performed, isotropic etching for removing damage of the trenches 18 may be performed. The annealing includes performing nitrogen-added annealing under a mixed gas atmosphere in which nitrogen ($N_2$) gas is added to hydrogen gas, after hydrogen annealing is performed under a hydrogen ($H_2$) gas atmosphere. The mixed gas atmosphere may contain a gas that is added thereto and contains 5 to 50% nitrogen with respect to the hydrogen gas.

Here, surfaces of the terrace portions B of the trenches 18 are etched by the hydrogen annealing and are planarized. Further, etching of the surfaces of the terrace portions B of the trenches 18 is suppressed by the nitrogen-added annealing. As a result, after planarization by the hydrogen annealing, the surfaces are nitrogen-terminated and fixed by the nitrogen-added annealing, whereby occurrences of surface roughness during cooling are eliminated. Therefore, the surfaces remain planarized, thereby enabling the surface roughness Ra of the terrace portions B of the trenches 18 to be maintained at 0.1 nm or less.

Further, the sidewalls of the trenches 18 of a formation surface of the gate insulating film are terminated by nitrogen in advance. Therefore, during post oxidation annealing (POA) treatment after formation of the gate insulating film 9, even when only oxygen ($O_2$) annealing is performed without including nitrogen, the surfaces are nitrogenized and therefore, favorable characteristics of the semiconductor device are enabled. Further, the sidewalls of the trenches 18 are terminated by nitrogen and therefore, a nitrogenizing treatment for the gate insulating film 9 is unnecessary.

Next, the gate insulating film 9 is formed along surfaces of the $n^+$-type source regions 7 and surfaces of the $p^{++}$-type contact regions 8 as well as the bottoms and the sidewalls of the trenches 18. The gate insulating film 9 may be formed by thermal oxidation by a heat treatment of a temperature of 1000 degrees C. in an oxygen atmosphere. Further, the gate insulating film 9 may be formed by a deposition method by a chemical reaction such as that for a high temperature oxide (HTO).

Next, on the gate insulating film 9, a polycrystalline silicon layer doped with, for example, phosphorus atoms is provided. The polycrystalline silicon layer may be formed so as to be embedded in the trenches 18. The polycrystalline silicon layer is patterned by photolithography and left in the trenches 18, thereby forming the gate electrodes 10.

Figure 9:
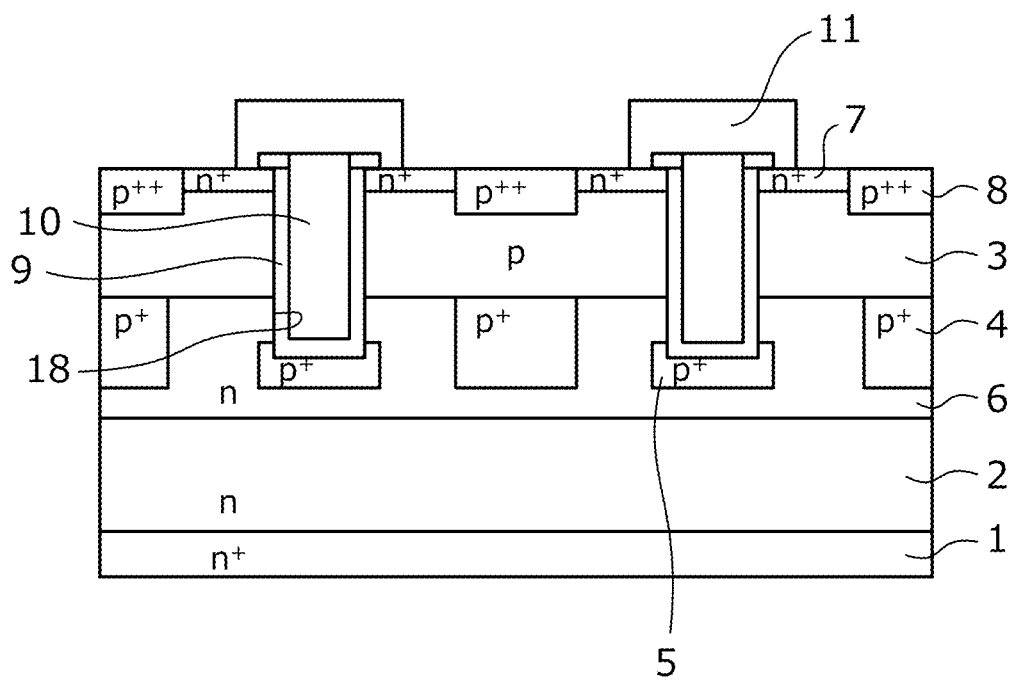
FIG. 9 is a cross-sectional view schematically depicting a state of the silicon carbide semiconductor device according to the embodiment during manufacture.

Next, for example, phosphate glass is deposited to have a thickness of about 1 μm and so as to cover the gate insulating film 9 and the gate electrodes 10, thereby forming the interlayer insulating film 11. Next, a barrier metal (not depicted) containing titanium (Ti) or titanium nitride (TiN) may be formed so as to cover the interlayer insulating film 11. The interlayer insulating film 11 and the gate insulating film 9 are patterned by photolithography, thereby forming contact holes exposing the $n^+$-type source regions 7 and the $p^{++}$-type contact regions 8. Thereafter, a heat treatment (reflow) is performed, thereby planarizing the interlayer insulating film 11. The state up to here is depicted in FIG. 9.

Next, in the contact holes and on the interlayer insulating film 11, a conductive film containing, for example, nickel (Ni) and forming the source electrode 13 is provided. The conductive film is patterned by photolithography, thereby leaving the source electrode 13 only in the contact holes.

Next, on the second main surface of the $n^+$-type silicon carbide semiconductor substrate 1, the back electrode 14 containing, for example, nickel is provided. Thereafter, a heat treatment in an inert gas atmosphere of 1000 degrees C. is performed, thereby forming the source electrode 13 and the back electrode 14 to be in ohmic contact with the $n^+$-type source regions 7, the $p^{++}$-type contact regions 8, and the $n^+$-type silicon carbide substrate 1.

Next, on the first main surface of the $n^+$-type silicon carbide substrate 1, an aluminum film having a thickness of about 5 μm is deposited by a sputtering technique and aluminum is removed by photolithography so as to cover the source electrode 13 and the interlayer insulating film 11, whereby the source electrode pad 15 is formed.

Next, at a surface of the back electrode 14, for example, titanium (Ti), nickel, and gold (Au) are sequentially stacked, thereby forming the drain electrode pad (not depicted). Thus, as described, the silicon carbide semiconductor device depicted in FIG. 1 is completed.

As described above, according to the silicon carbide semiconductor device according to the embodiment, after the hydrogen annealing is performed after trench formation, the nitrogen-added annealing is performed. As a result, after planarization, the surfaces are nitrogen-terminated and fixed, enabling the surface roughness Ra of the terrace portions of the trenches to be set to be at most 0.1 nm. Therefore, surface roughness of the trench sidewalls is reduced and the effects of interface roughness scattering are reduced, thereby enabling enhancement of mobility to be maximized.

Figure 10:
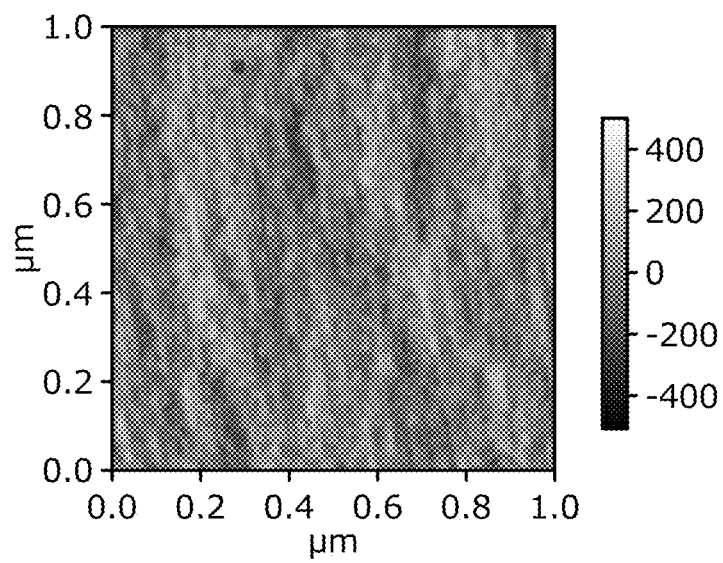
FIG. 10 is an atomic force microscope image of terrace portions of a silicon carbide semiconductor device according to an example.

FIG. 10 is an atomic force microscope image of terrace portions of a silicon carbide semiconductor device according to an example. In the example, after hydrogen annealing at 1400 degrees C. and a pressure of 300 Torr is performed for 18 minutes after formation of the trenches 18, the nitrogen-added annealing was performed for 15 minutes. In the nitrogen-added annealing, nitrogen gas was added at a flow ratio (nitrogen gas/hydrogen gas) of 10% with respect to hydrogen gas. FIG. 10 is an atomic force microscope (AFM) image of the terrace portions B before formation of the gate insulating film 9 after the annealing. According to FIG. 10, in the example, the surface roughness Ra of the terrace portions B of the trenches 18 was 0.0578 nm. Here, while measurement reflect values before the formation of the gate insulating film 9, similar values are presumed after completion of the semiconductor device.

Figure 11:
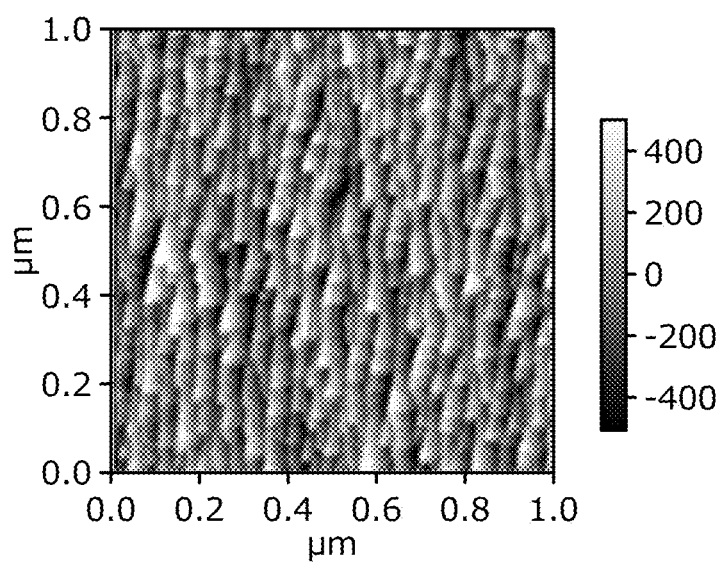
FIG. 11 is an atomic force microscope image of terrace portions of a silicon carbide semiconductor device of a first conventional example.

Next, for comparison, a silicon carbide semiconductor device was manufactured by a conventional method. FIG. 11 is an atomic force microscope image of terrace portions of a silicon carbide semiconductor device of a first conventional example. In the first conventional example, only hydrogen annealing at 1400 degrees C. and a pressure of 300 Torr for 18 minutes was performed. According to FIG. 11, in the first conventional example, the surface roughness Ra of the terrace portions B of the trenches 18 was 0.1425 nm.

Figure 12:
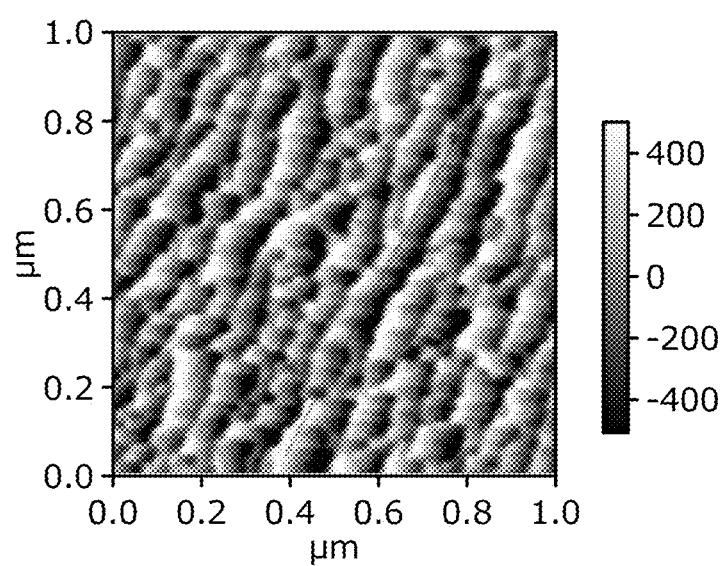
FIG. 12 is an atomic force microscope image of terrace portions of a silicon carbide semiconductor device of a second conventional example.

Further, FIG. 12 is an atomic force microscope image of terrace portions of a silicon carbide semiconductor device of a second conventional example. In the second conventional example, only the nitrogen-added annealing at 1400 degrees C. and a pressure of 300 Torr for 18 minutes was performed. In the nitrogen-added annealing, nitrogen gas was added at a ratio of 10% relative to hydrogen. According to FIG. 12, in the second conventional example, the surface roughness Ra of the terrace portions B of the trenches 18 was 0.2151 nm.

In this manner, while the surface roughness Ra of the terrace portions B of the trenches 18 was at most 0.1 nm in the example, the surface roughness Ra was at least 0.1 nm in the first conventional example and the second conventional example. Further, when the flow ratio (nitrogen gas/hydrogen gas) of hydrogen gas and nitrogen gas in the experiment above was about 5%, 50% to confirm effective ranges for conditions, the surface roughness was 0.0879 nm, 0.0725 nm, respectively, and was maintained to be 0.1 nm or less.

Figure 13:
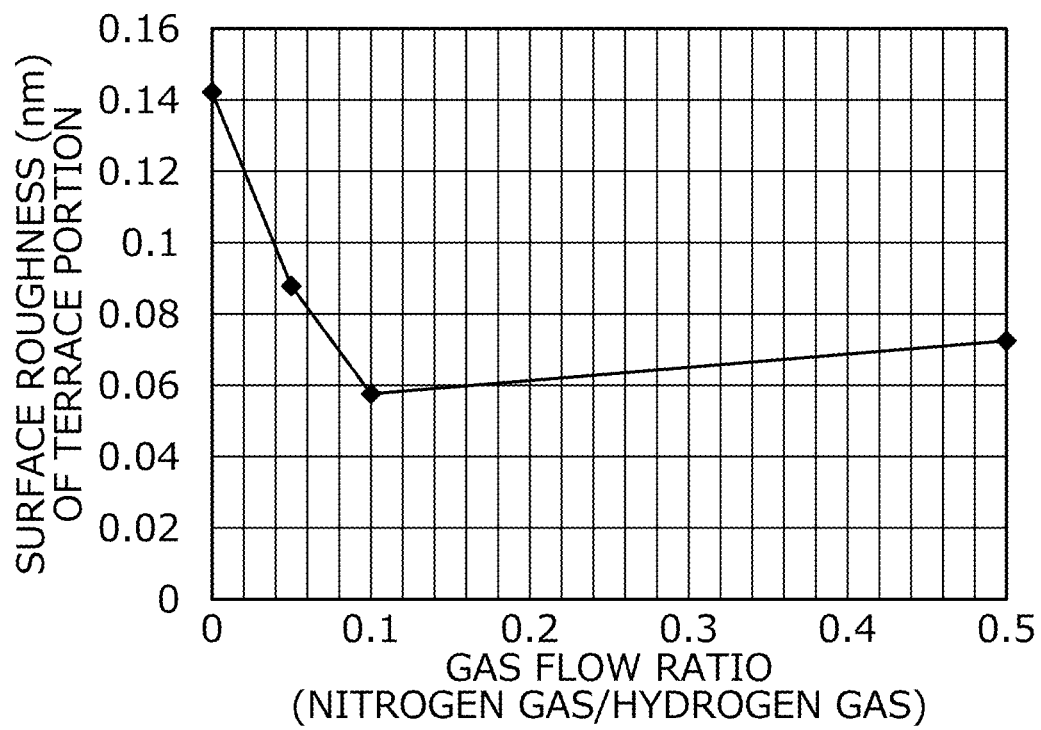
FIG. 13 is graph depicting, as a relationship, dependence of results of the example and a ratio of nitrogen gas to hydrogen gas and surface roughness of the terrace portions.

FIG. 13 is graph depicting, as a relationship, dependence of results of the example and the ratio of nitrogen gas to hydrogen gas and the surface roughness of the terrace portions. From the results, by setting the gas flow ratio (nitrogen gas/hydrogen gas) in a range from 1% to 80%, the surface is smoothed and more advantageously, when set in a range from 4% to 50%, the surface roughness may be maintained to be 0.1 nm or less. Further, the gas flow ratio may be most advantageously set in a range from 5% to 50%.

Figure 14:
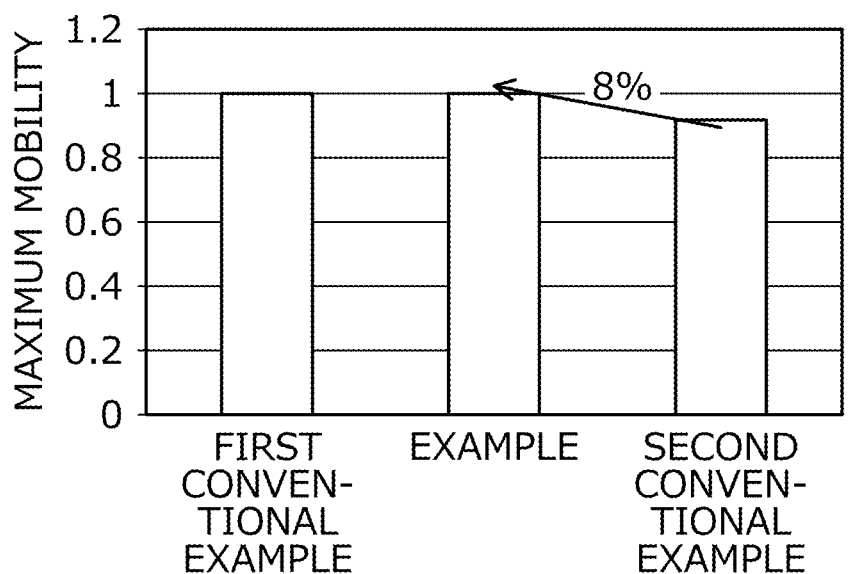
FIG. 14 is a chart depicting maximum mobilities of the silicon carbide device according to the example and the silicon carbide semiconductor devices of the first and the second conventional examples.

FIG. 14 is a chart depicting maximum mobilities of the silicon carbide device according to the example and the silicon carbide semiconductor devices of the first and the second conventional examples. FIG. 14 depicts ratios with respect to the example with the maximum mobility of the example being set to 1. Here, the maximum mobilities of the example and the first and the second conventional examples where compared for a case in which the silicon carbide semiconductor devices are manufactured under the annealing conditions above and assuming that the processes after the formation of the gate insulating film 9 are the same. As depicted in FIG. 14, in the example, as compared to the second conventional example in the case in which only the nitrogen-added annealing was performed, the maximum mobility exhibits 8% improvement. Further, in the example, as compared to the first conventional example in which only the hydrogen annealing was performed, the maximum mobility exhibited no difference. This was due to the processes being the same after the formation of the gate insulating film 9.

Further, in the embodiment of the present invention, while a trench-type MOSFET has been described as an example, without limitation hereto, application is further possible to semiconductor devices of various configurations such as MOS-type semiconductor devices like IGBTs having a trench structure. Further, in the embodiment described above, while a case in which silicon carbide is used as a wide bandgap semiconductor has been described as an example, similar effects are obtained in cases in which a wide bandgap semiconductor other than silicon carbide such as gallium nitride (GaN) is used. Further, in the embodiments, while the first conductivity type is assumed to be an n-type and the second conductivity type is assumed to be a p-type, the present invention is similarly implemented when the first conductivity type is a p-type and the second conductivity type is an n-type.

As described above, after the hydrogen annealing is performed after the trench formation, the nitrogen-added annealing is performed. As a result, after planarization, the surfaces are nitrogen-terminated and fixed, enabling the surface roughness Ra of the terrace portions of the trenches to be set to be at most 0.1 nm. Therefore, surface roughness of the trench sidewalls is reduced and the effects of interface roughness scattering are reduced, thereby enabling enhancement of mobility to be maximized.

The semiconductor device and the method of manufacturing a semiconductor device according to the present invention achieve an effect in that the surface roughness of trench sidewalls is reduced and the effects of interface roughness scattering are reduced, thereby enabling enhancement of mobility to be maximized.

In this manner, the semiconductor device and the method of manufacturing a semiconductor device of the present invention are useful for power converting equipment and power semiconductor devices used in power source devices such as in various types of industrial machines and are particularly suitable for semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   preparing a semiconductor substrate of a first conductivity type, the semiconductor substrate having a front surface and a back surface;
   forming a first semiconductor layer of the first conductivity type, at the front surface of the semiconductor substrate, the first semiconductor layer having an impurity concentration lower than that of the semiconductor substrate, the first semiconductor layer having a first side and a second side opposite to each other, the first side facing the semiconductor substrate;
   forming a second semiconductor layer of a second conductivity type, at the second side of the first semiconductor layer;
   selectively forming a first semiconductor region of the first conductivity type in the second semiconductor layer, the first semiconductor region having an impurity concentration higher than that of the semiconductor substrate;
   forming a trench penetrating the first semiconductor region and the second semiconductor layer, to reach the first semiconductor layer;
   performing a first annealing treatment to the trench in a hydrogen atmosphere, and, after the first annealing treatment, performing a second annealing treatment to the trench in a mixed gas atmosphere containing hydrogen and nitrogen; and
   forming a gate electrode in the trench, via a gate insulating film.

2. The method according to claim 1, wherein
   for the mixed gas atmosphere, a gas flow ratio of a nitrogen gas to a hydrogen gas is in a range from 1% to 80%.

3. The method according to claim 1, wherein
   for the mixed gas atmosphere, a gas flow ratio of a nitrogen gas to a hydrogen gas is in a range from 4% to 50%.

4. The method according to claim 1, wherein
   for the mixed gas atmosphere, a gas flow ratio of a nitrogen gas to a hydrogen gas is in a range from 5% to 50%.

5. The method according to claim 1, wherein
   the trench has a sidewall that includes a terrace portion, surface roughness of the terrace portion being at most 0.1 nm.

* * * * *